(12) United States Patent
Kuo et al.

(10) Patent No.: US 11,621,539 B2
(45) Date of Patent: Apr. 4, 2023

(54) MULTI-PHASE LASER DRIVER TECHNIQUES

(71) Applicant: Analog Devices, Inc., Norwood, MA (US)

(72) Inventors: Shawn S. Kuo, Arlington, MA (US); James Lin, Reading, MA (US); Ronald A. Kapusta, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 256 days.

(21) Appl. No.: 16/890,600

(22) Filed: Jun. 2, 2020

(65) Prior Publication Data
US 2021/0376566 A1    Dec. 2, 2021

(51) Int. Cl.
| | |
|---|---|
| *H01S 5/042* | (2006.01) |
| *H01S 3/102* | (2006.01) |
| *H03K 17/78* | (2006.01) |
| *H01S 3/00* | (2006.01) |

(52) U.S. Cl.
CPC ............ *H01S 5/0428* (2013.01); *H01S 3/005* (2013.01); *H01S 3/1024* (2013.01); *H03K 17/78* (2013.01); *H03K 2217/0036* (2013.01)

(58) Field of Classification Search
CPC ...... H01S 5/0428; H01S 3/005; H01S 3/1024; H03K 17/78; H03K 2217/0036
See application file for complete search history.

(56) References Cited

U.S. PATENT DOCUMENTS

| | | | |
|---|---|---|---|
| 4,275,317 A * | 6/1981 | Frosch | H01S 3/097 372/38.03 |
| 7,439,945 B1 | 10/2008 | Await et al. | |
| 9,368,936 B1 | 6/2016 | Lenius et al. | |
| 9,847,736 B2 | 12/2017 | Grootjans et al. | |
| 10,048,358 B2 | 8/2018 | Berger et al. | |
| 10,256,605 B2 | 4/2019 | Gassend et al. | |
| 2003/0016711 A1 | 1/2003 | Crawford | |
| 2005/0041707 A1 | 2/2005 | Mangano et al. | |
| 2010/0283322 A1 | 11/2010 | Wibben | |
| 2017/0085057 A1 | 3/2017 | Barnes et al. | |

(Continued)

FOREIGN PATENT DOCUMENTS

| | | | |
|---|---|---|---|
| CN | 108370626 B | 1/2020 | |
| EP | 1263140 B1 | 5/2008 | |
| EP | 0408142 A1 * | 1/2013 | ............. H01S 3/097 |

OTHER PUBLICATIONS

Pfeffer, H., et al., "High Burst Rate Charging System for the Lithium Lens Power Supply", Fermi Research Alliance, LLC, (2018), 3 pgs.

*Primary Examiner* — Xinning (Tom) Niu
(74) *Attorney, Agent, or Firm* — Schwegman Lundberg & Woessner, P.A.

(57) ABSTRACT

This disclosure is directed to, among other things, techniques to quickly replenish a capacitance of a laser diode driver circuit after an optical pulse, which can enable a burst of pulses (more than one pulse), such as to enable pulse coding. An energy reservoir circuit can be coupled to a laser diode driver circuit and to a power supply circuit and configured to store enough energy to fire the RD laser diode driver more than once. The energy reservoir circuit can act as an intermediate interface between the RD laser diode driver and the power supply circuit to better optimize the current requirements of each block.

20 Claims, 6 Drawing Sheets

(56) References Cited

U.S. PATENT DOCUMENTS

| | | | |
|---|---|---|---|
| 2017/0317516 A1* | 11/2017 | Stern | .................... H05B 47/125 |
| 2018/0323576 A1 | 11/2018 | Crawford et al. | |
| 2019/0229493 A1 | 7/2019 | Stern | |
| 2020/0333438 A1* | 10/2020 | Petrov | .................... H04B 10/50 |
| 2021/0098959 A1* | 4/2021 | Zhang | ................ H01S 3/10046 |

* cited by examiner

MULTI-PHASE LASER DRIVER TECHNIQUES

FIELD OF THE DISCLOSURE

This document pertains generally, but not by way of limitation, to integrated circuits, in particular to circuits for driving laser diodes.

BACKGROUND

Many active optical remote sensing systems such as light detection and ranging (LIDAR), time-of-flight cameras, and range finders utilize pulsed semiconductor light sources to illuminate scenes. Optical detectors (also typically based on semiconductors) collect reflected light to determine the presence, distance, size, and speed of objects in a scene. These optical systems have numerous applications, including autonomous navigation, infrastructure monitoring, medicine, and defense.

Semiconductor light sources typically utilize diode structures (P-N junctions) that conduct current when forward biased. For semiconductor materials with direct bandgaps, current carriers (electrons and holes) recombine at the junction to produce light in direct proportion to the current. Electronic driver circuits are used to provide this current, where the compliance voltage, current magnitude, and temporal properties of the continuous or pulsed current source vary depending on the requirements of the application, system design, and power supply constraints.

SUMMARY OF THE DISCLOSURE

This disclosure is directed to, among other things, techniques to quickly replenish a capacitance of a laser diode driver circuit after an optical pulse, which can enable a burst of pulses (more than one pulse), such as to enable pulse coding. The present inventors have recognized that an energy reservoir circuit can be coupled to a laser diode driver circuit and to a power supply circuit and configured to store enough energy to fire the RD laser diode driver more than once. The energy reservoir circuit can act as an intermediate interface between the RD laser diode driver and the power supply circuit to better optimize the current requirements of each block. The energy reservoir circuit can quickly replenish the capacitance of the laser diode driver after an optical pulse, which can enable a burst of pulses (more than one pulse), such as to enable pulse coding. In addition, the power supply can slowly charge the energy reservoir circuit during the idle time between series of bursts.

In some aspects, this disclosure is directed to an optical transmitter circuit comprising: a laser diode driver including an LC circuit coupled to a laser diode, wherein the LC circuit is configured to form a resonance that determines a transmitted optical pulse width and to transfer energy to the laser diode for an individual optical current pulse; an energy reservoir circuit coupled to the laser diode driver and to a power supply circuit, the energy reservoir circuit including an energy storage element sized to store energy sufficient for the laser diode driver to generate multiple output current pulses, wherein the energy reservoir circuit is configured to receive energy from the power supply circuit and transfer at least some of the received energy to the LC circuit; and an isolation circuit configured to intermittently electrically isolate the energy storage element from the laser diode driver.

In some aspects, this disclosure is directed to a method of generating output current pulses of a diode, the method comprising: transferring energy from a power supply circuit to an energy storage element of an energy reservoir circuit, the energy storage element sized to store energy for a laser diode driver to generate multiple output current pulses; transferring at least some of the energy stored in the energy storage element to a resonant discharge laser driver circuit including a laser diode; and intermittently electrically isolating the energy storage element from the resonant discharge laser driver circuit.

In some aspects, this disclosure is directed to an optical transmitter circuit comprising: a laser diode driver including an LC circuit coupled to a laser diode, wherein the LC circuit is configured to form a resonance that determines a transmitted optical pulse width and to transfer energy to the laser diode for an individual optical current pulse; means for storing energy sufficient for the laser diode driver to generate multiple output current pulses, the means for storing energy coupled to the laser diode driver and to a power supply circuit, wherein the means for storing energy is configured to receive energy from the power supply circuit and transfer at least some of the received energy to the LC circuit; and an isolation circuit configured to intermittently electrically isolate the energy storage element from the laser diode driver.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Optical systems such as light detection and ranging (LIDAR) systems, time-of-flight cameras, and range finders, can emit one or more pulses of light (e.g., modulated light source) toward one or more objects, and the arrival time of the light reflected from the object(s) is recorded. Based on the arrival time and the speed of light, the distance between the light source and the object(s) can be derived.

A diode can be driven with narrow and high current pulses to emit light pulses onto the object, which can be centimeters to hundreds of meters away. The speed of light is very fast, therefore very short light pulses are needed to achieve meter or centimeter resolution. Accordingly, narrow current pulses are needed to drive the diode to generate the train of short light pulses.

Pulsed laser drivers in time of flight (ToF) based LIDAR systems use high powered short pulses from 100 picoseconds (ps) to 100 nanoseconds (ns). The power of these pulses can sometimes be limited by concerns for eye safety. Approaches for architectures for these drivers can include resonant capacitive discharge architectures or hard switching field-effect transistor (FET) architectures. The FETs can be metal-oxide-semiconductor (MOS) FETs or gallium nitride (GAN) FETs, but are not limited to these particular FETs.

For a high-power LIDAR application, the relationship between pulse width and power can be determined by the equation $V=L*(di/dt)$ and some architecture related constants. The voltage V can be set by the voltage of the driver. The inductance L can be determined by the material properties and physical dimensions between the driver and the laser diode. For a given inductance and voltage, the optical power (proportional to current) can be determined by the pulse width. Generally speaking, shorter, higher power pulses can be used to see further, distinguish objects, and stay within the eye safety limit.

Figure 1:
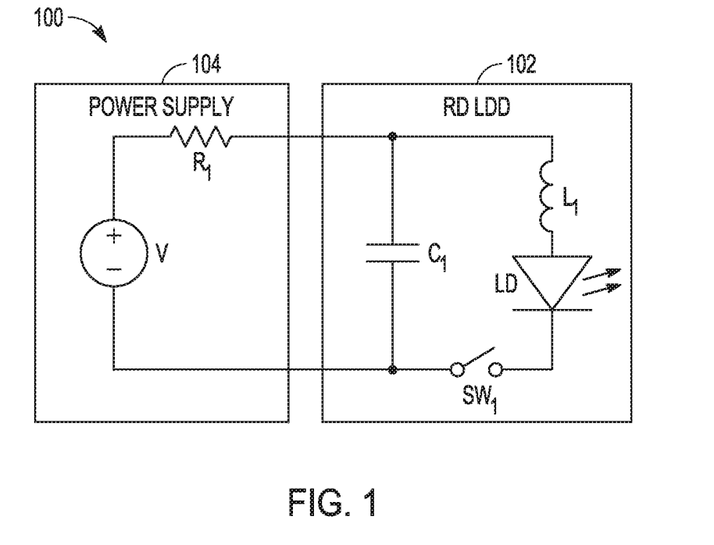
FIG. 1 is an example of an optical transmitter circuit including a resonant discharge (RD) laser diode driver circuit coupled to a power supply.

FIG. 1 is an example of an optical transmitter circuit 100 including a resonant discharge (RD) laser diode driver circuit 102 coupled to a power supply 104. Examples of RD laser diode driver circuits can include resonant capacitive discharge (RCD) laser diode driver circuits and resonant inductive discharge (RID) laser diode driver circuits. The RD laser diode driver circuit 102 can include a switch SW1, e.g., a transistor, a laser diode LD, and an LC circuit having an inductance L1 and a capacitance C1. One or both of the inductance L1 and the capacitance C1 can be implicit (parasitic) or explicit (actual component). It should be noted that there are other configurations of LC resonance, such as series LC resonance, and this disclosure is not limited to the particular configurations shown, such as the parallel configuration shown in FIG. 1. Coupled to the RD laser diode driver circuit 102 is the power supply 104, which can be implemented in many ways but can be represented as including a voltage source V and an internal impedance R1.

The RD laser diode driver circuit can rely on the LC resonance of L1 and C1 to fire a laser pulse. The power supply 104 charges the capacitance C1 and, when the switch SW1 is closed, the LC resonance of L1 and C1 generates an output current pulse through the laser diode LD, which emits an optical pulse. When the output current pulse is completed, the switch SW1 is opened.

Figure 2:
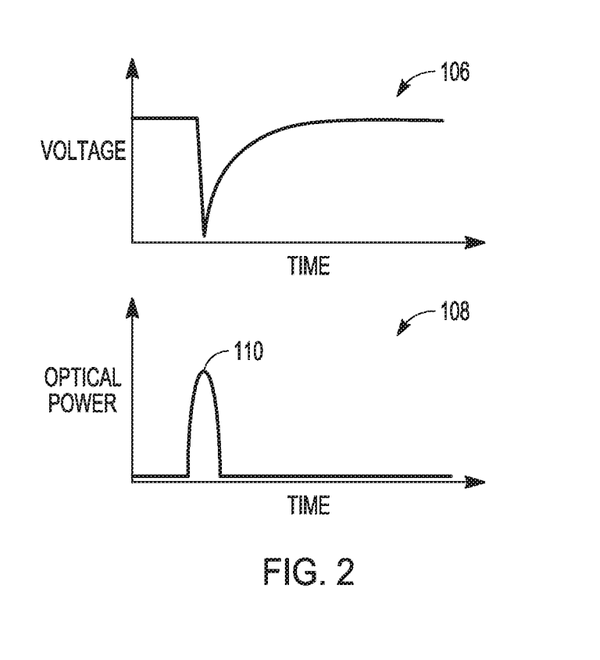
FIG. 2 depicts various waveforms associated with the circuit of FIG. 1.

FIG. 2 depicts various waveforms associated with the circuit of FIG. 1. The top graph 106 depicts the voltage on the capacitance C1 in FIG. 1 with respect to time for a typical RD laser diode driver circuit. The bottom graph 108 depicts the optical power emitted by the laser diode LD of FIG. 1 with respect to time for a typical RD laser diode driver circuit.

As seen in FIG. 2, the voltage on the capacitance C1 can be depleted after the switch SW1 in FIG. 1 is closed and the laser diode LD fires the optical pulse 110. The switch SW1 in FIG. 1 can be opened and the power supply 104 of FIG. 1 can begin to charge up the capacitance C1. The recovery of the capacitance C1 can depend on the output current of the power supply 104. Typically, the power supply 104 cannot deliver high peak current to the capacitance C1, which can result in a long recovery time.

A long recovery time can make optical pulse coding challenging. Optical pulse coding is a technique in which a sequence of optical pulses is transmitted by a system, such as a LIDAR system, to assist the system in distinguishing its return signals from amongst other systems that can be present.

If the power supply 104 is sized to have a large current capability for fast C1 recovery, it can interfere with the LC resonance of the RD laser diode driver circuit. In addition, it is possible that a failure of the switch SW1 can cause a large current through the laser diode LD, which can destroy the device and/or not be eye safe.

To overcome these and other problems, the present inventors have recognized that an energy reservoir circuit can be coupled to a laser diode driver and to a power supply circuit and configured to store enough energy to fire the RD laser diode driver more than once. The energy reservoir circuit can act as an intermediate interface between the RD laser diode driver and the power supply circuit to better optimize the current requirements of each block. The energy reservoir circuit can quickly replenish the capacitance C1 after an optical pulse, which can enable a burst of pulses (more than one pulse), such as to enable pulse coding. In addition, the power supply can slowly charge the energy reservoir circuit during the idle time between series of bursts.

In a typical LIDAR or time-of-flight system, the temporal spacing between optical pulses within a single burst can often be comparable to or less than the time-of-flight for that pulse to a target at maximum range. As a non-limiting example for purposes of explanation only, in a LIDAR system with a range of up to 150 meters, the round-trip optical time-of-flight is 1 microseconds (μs), and the temporal spacing between pulses can be as long as a few microseconds and as short as a few nanoseconds, limited by the optical pulse width. By comparison, the temporal spacing between series of bursts can often be much longer than the time-of-flight for a pulse to a target at maximum range. Continuing the non-limiting example above, the spacing between pulses could be 10 μs or more, and can be limited by the ability of the power supply to recharge the energy reservoir and/or laser diode driver circuit.

Figure 3:
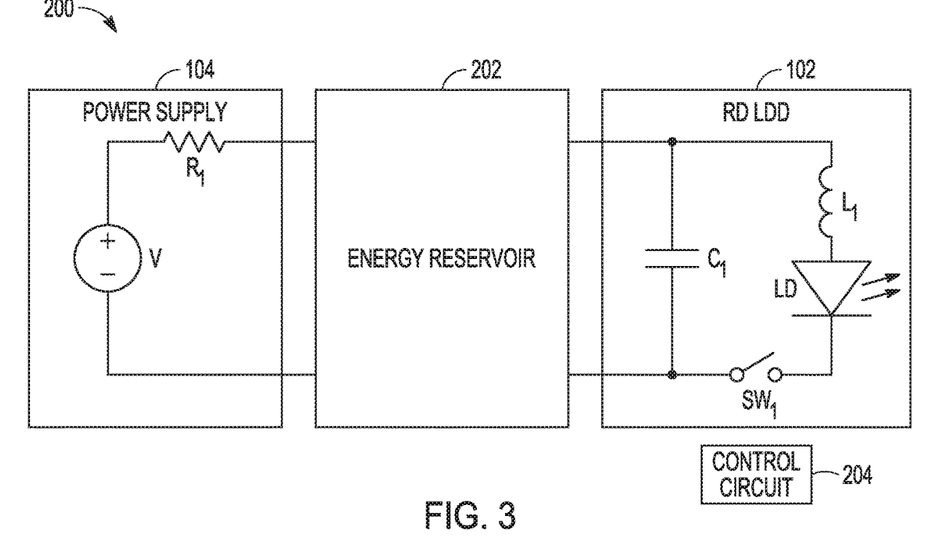
FIG. 3 is an example of an optical transmitter circuit 200 including a resonant discharge (RD) laser diode driver circuit coupled to an energy reservoir circuit, in accordance with various techniques of this disclosure.

FIG. 3 is an example of an optical transmitter circuit 200 including a resonant capacitive discharge (RD) laser diode driver circuit coupled to an energy reservoir circuit, in accordance with various techniques of this disclosure. Some of the components in the optical transmitter circuit 200 of FIG. 3 are similar to components in FIG. 1 and are labeled with similar reference numbers and, for purposes of conciseness, will not be described again. The optical transmitter circuit 200 can be coupled to a control circuit 204 that can control the operation of various switches described in more detail below.

As mentioned above, one or both of the inductance L1 and the capacitance C1 of the LC circuit of the RD laser diode driver circuit 102 can be implicit (parasitic) or explicit (actual component). For example, the inductance L1 can be a parasitic inductance intrinsic to circuit components of the laser diode driver circuit and interconnects therebetween. The LC circuit including the inductance L1 and the capacitance C1 can form a resonance that determines a transmitted optical pulse width and can transfer to the laser diode energy sufficient for an individual optical current pulse.

Using various techniques of this disclosure, an energy reservoir circuit 202 can be coupled to the laser diode driver circuit 102 and to the power supply circuit 104. As described in more detail below, the energy reservoir circuit 202 can include an energy storage element, such as shown in FIGS. 5-11, sized to store energy sufficient for the laser diode driver circuit 102 to generate multiple output current pulses. The energy reservoir circuit 202 can be configured to receive energy from the power supply circuit 104 and transfer at least some of the received energy to the capacitance C1, such as between individual output current pulses.

By using various techniques of this disclosure, the optical transmitter circuit 200 of FIG. 3 can store enough energy in the energy reservoir circuit 202 to account for multiple output optical pulses. The energy reservoir circuit 202 can quickly replenish the capacitance C1 to enable a subsequent pulse in a short amount of time. In addition, the power supply circuit 104 can slowly replenish the energy reservoir circuit 202 by outputting a low average current or low DC current.

As mentioned above, the energy reservoir circuit 202 can include an energy storage element sized to store energy sufficient for the laser diode driver circuit 102 to generate multiple output current pulses based on a control circuit, such as the control circuit 204 of FIG. 3, controlling the operation of one or more switches. In some examples, the multiple output current pulses can form a sequence of pulses. In some examples, the sequence of pulses can be a coded sequence of pulses, e.g., pulses with a variable (random) temporal spacing between them.

As mentioned above, an energy reservoir circuit can act as an intermediate interface between the RD laser diode driver and the power supply circuit to better optimize the current requirements of each block. For purposes of explanation only, a non-limiting example is shown and described below with respect to FIGS. 4A-4C that illustrates the benefits of using an energy reservoir circuit.

Figure 4A:
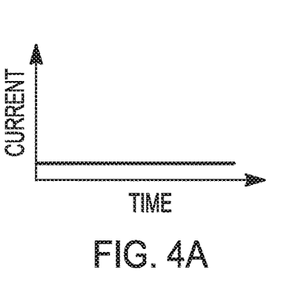
FIGS. 4A-4C depict conceptual current waveforms using the system shown in FIG. 3.
Figure 4B:
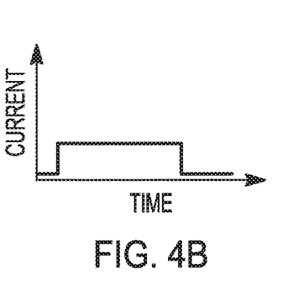
Figure 4C:
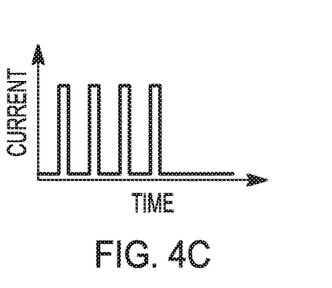

FIGS. 4A-4C depict conceptual current waveforms using the system shown in FIG. 3. FIG. 4A depicts a current waveform output from the power supply circuit 104 of FIG. 3. FIG. 4B depicts a current waveform output from the energy reservoir circuit 202 of FIG. 3. FIG. 4C depicts a current waveform generated within the RD laser diode driver circuit 102 of FIG. 3, transferring energy between its capacitive and inductive elements and creating an optical pulse.

Referring to FIG. 4C, assume that a laser current pulse is 5 nanoseconds (ns) and 30 amps (A), a burst of pulses includes four (4) laser current pulses spaced 50 ns apart, and a series of bursts are each spaced 20 microseconds (µs) apart. The energy stored in a capacitor equals $0.5*C*V^2$. If the laser diode has a slope efficiency of 1 W/A, there is 0.15 microjoule (µJ)/pulse and 0.6 µJ/burst of optical energy. To satisfy a requirement of 0.15 µJ/pulse in 50 ns, the energy reservoir circuit requires an output current rating of 3A, as depicted in FIG. 4B. To satisfy 0.6 µJ/burst in 20 µs, the power supply circuit requires an output current rating of mA, as depicted in FIG. 4A.

Without using an energy reservoir circuit, however, the power supply circuit 104 would need to supply 3A of current. By using an energy reservoir circuit, as described in this disclosure, the capacitance C1 can be quickly recharged to enable a subsequent pulse in a short amount of time, and the power supply circuit 104 can output a low average current or low DC current, which can make the power supply circuit less expensive and can also simplify the mechanical assembly, such as the physical spacing or connections between elements.

Figure 5:
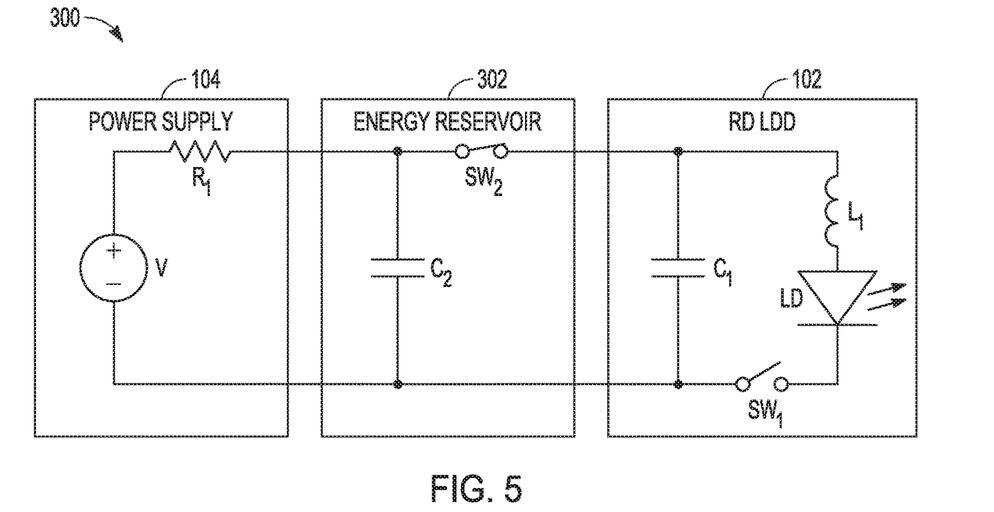
FIG. 5 is another example of an optical transmitter circuit 300 including a resonant discharge (RD) laser diode driver circuit coupled to an energy reservoir circuit, in accordance with various techniques of this disclosure.

FIG. 5 is another example of an optical transmitter circuit 300 including a resonant capacitive discharge (RD) laser diode driver circuit coupled to an energy reservoir circuit, in accordance with various techniques of this disclosure. Some of the components in the optical transmitter circuit 300 of FIG. 5 are similar to components in FIGS. 1 and 3 and are labeled with similar reference numbers and, for purposes of conciseness, will not be described again. The optical transmitter circuit 300 of FIG. 5 is an example of the optical transmitter circuit of FIG. 3.

In some examples, the energy storage element of the energy reservoir circuit 302 can include a capacitance C2, such as shown in FIG. 5. The capacitance C2 can be sized to store energy sufficient for the laser diode driver circuit 102 to generate multiple output current pulses. In some examples, a control circuit, such as the control circuit 204 of FIG. 3, can control operation of one or more switches to generate a pulse code using the multiple output current pulses.

In some examples, the energy reservoir circuit 302 can include an isolation circuit configured to electrically isolate the energy storage element for a duration of the individual output current pulses. For example, in FIG. 5, the energy reservoir circuit 302 can include a switch SW2 coupled to the capacitance C2. The switch SW2 can electrically isolate the energy storage element, namely the capacitance C2 in FIG. 5, from the laser diode driver circuit 102, for a duration of the individual output current pulses so that the capacitance C2 will not interfere with the resonance of the LC circuit of the laser diode driver circuit 102. In this manner, the isolation circuit can intermittently electrically isolate the energy store element such that it does not interact with the function of the of the laser diode driver LC circuit.

In the capacitive implementation shown in FIG. 5, the power supply circuit 104 can charge capacitance C2 with enough energy to fire a burst of pulses. In some examples, the burst of pulses can be used for pulse coding, e.g., two or more sequential pulses. After the capacitance C1 has been depleted following an output current pulse, a control circuit, such as the control circuit 204 of FIG. 3, can close the switch SW2 so that the capacitance C2, acting as an energy storage element, can quickly replenish the capacitance C1 by transferring energy. By controlling a timing of the switch operation, such as by programming the pulse width of SW2, the control circuit, such as the control circuit 204 of FIG. 3, can pulse code the optical power. In some examples, a control circuit, such as the control circuit 204 of FIG. 3, can control the operation of switch SW2 to control an amplitude of the individual output current pulses.

Figure 6:
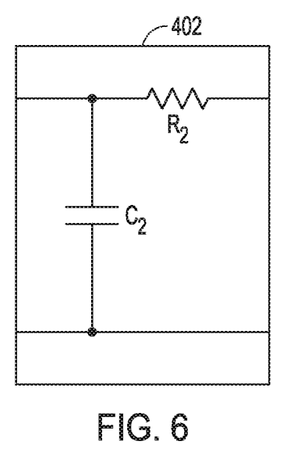
FIGS. 6-8 depict various capacitive energy reservoir circuits that implement techniques of this disclosure.
Figure 7:
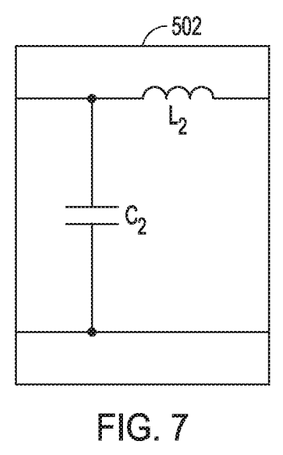
Figure 8:
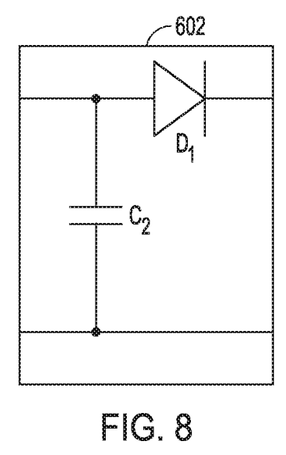

FIGS. 6-8 depict various capacitive energy reservoir circuits that implement techniques of this disclosure. Each of the energy reservoir circuits of FIGS. 6-8 can utilize a capacitance, such as the capacitance C2 of FIG. 5, as an energy storage element and can be combined with a power supply circuit, such as the power supply circuit 104 of FIG. 5, and with a RD laser diode driver circuit, such as the RD laser diode driver circuit of FIG. 5. In addition, each of the energy reservoir circuits of FIGS. 6-8 can utilize an isolation circuit configured to electrically isolate the energy storage element, e.g., the capacitance C2, from the laser diode driver for a duration of the individual output current pulses.

In FIG. 6, the isolation circuit of the energy reservoir circuit 402 can include a resistance R2 (implicit or explicit), instead of the switch SW2 of FIG. 5. The isolation between the LC resonance formed by the LC circuit of the RD laser diode driver circuit, such as shown in FIG. 5, and the capacitance C2 of the energy reservoir circuit 402 can be achieved by the RC time constant provided by the combination of the resistance R2 and the capacitance C1, relative to the period of the LC resonance of the laser diode driver circuit.

In FIG. 7, the isolation circuit of the energy reservoir circuit 502 can include an inductance L2 (implicit or explicit), instead of the switch SW2 of FIG. 5. The isolation between the LC resonance formed by the LC circuit of the RD laser diode driver circuit, such as shown in FIG. 5, and the capacitance C2 of the energy reservoir circuit 502 can be achieved by the LC resonance provided by the combination of the inductance L2 and the capacitance C1, relative to the period of the LC resonance of the laser diode driver circuit.

In FIG. 8, the isolation circuit of the energy reservoir circuit 502 can include a diode D1, instead of the switch SW2 of FIG. 5. The isolation between the LC resonance formed by the LC circuit of the RD laser diode driver circuit, such as shown in FIG. 5, and the capacitance C2 of the energy reservoir circuit 602 can be achieved by the LC resonance provided by the capacitance C1 and the combination of the diode D1 and the parasitic inductance along its trace, relative to the period of the LC resonance of the laser diode driver circuit.

Figure 9:
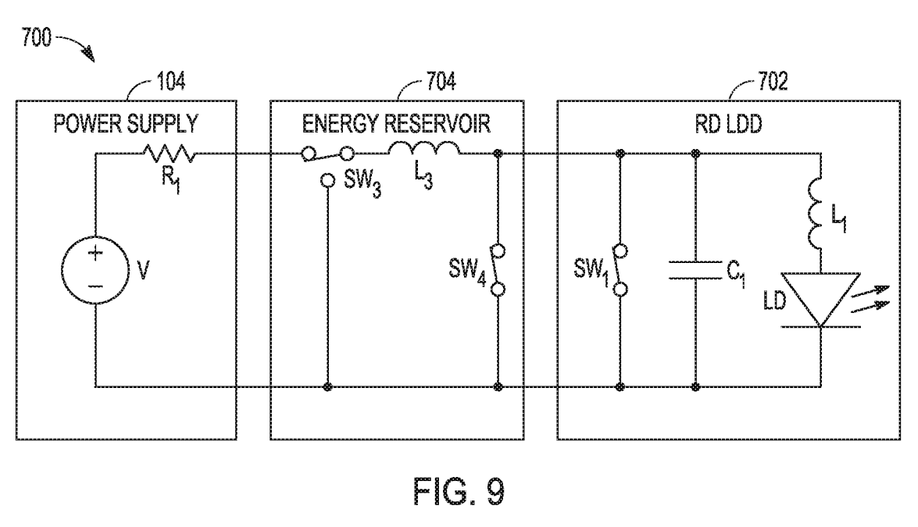
FIG. 9 is another example of an optical transmitter circuit including a resonant discharge (RD) laser diode driver circuit coupled to an energy reservoir circuit, in accordance with various techniques of this disclosure.

FIG. 9 is another example of an optical transmitter circuit of FIG. 3 including a resonant discharge laser diode driver circuit coupled to an energy reservoir circuit, in accordance with various techniques of this disclosure. The laser diode driver circuit 702 can include a switch SW1, e.g., a transistor, a laser diode LD, and an LC circuit having an inductance L1 and a capacitance C1. One or both of the inductance L1 and capacitance C1 can be implicit (parasitic) or explicit (actual component). Coupled to the laser diode driver circuit 702 is the energy reservoir 704 and the power supply 104 sequentially. The power supply 104 is similar to components in FIGS. 1 and 3 and are labeled with similar reference numbers and, for purposes of conciseness, will not be described again.

A non-limiting laser diode driver circuit 702 is described below. The laser diode driver circuit 702 receives a current input that can be shunted through a switch SW1 in the OFF state of the optical transmitter circuit 700. When the switch SW1 opens, the LC resonance of the inductance L1 and the capacitance C1 can generate an output current pulse through the laser diode LD, which can emit an optical current pulse. When the output current pulse is completed, a control circuit, such as the control circuit 204 of FIG. 3, can close the switch SW1 again. In some examples, the energy storage element of the energy reservoir circuit 704 can include an inductance L3, such as shown in FIG. 9.

The amount of energy stored in the inductor is given by one half the inductance multiplied by the square of the current ($0.5*L*I^2$). The inductance L3 can be sized to store energy sufficient for the laser diode driver circuit 702 to generate multiple output current pulses. In some examples, a control circuit, such as the control circuit 204 of FIG. 3, can control operation of one or more switches to generate a pulse code using the multiple output current pulses.

In some examples, the energy reservoir circuit 704 can include an isolation circuit configured to electrically isolate the energy storage element when the laser diode driver circuit 702 is not firing. Unlike the isolation circuit of FIG. 5, for example, which can electrically isolate the energy storage element for a duration of the individual output current pulses, the energy storage element of FIG. 9, namely the inductance L3 is not isolated during the individual output current pulses. Rather, it is connected to the RD LDD during the individual output current pulses. To isolate the energy reservoir circuit 704, a control circuit, such as the control circuit 204 of FIG. 3, can turn the parallel switch SW4 ON and shunt the inductor current back into the power supply 104 and not into the laser diode LD, which can prevent the laser diode LD from firing. In this manner, the isolation circuit can intermittently electrically isolate the energy store element such that it does not interact with the function of the of the laser diode driver LC circuit.

In FIG. 9, the energy reservoir circuit 704 can include a set of charging switches SW3 and SW4 and an energy storage element, such as the inductance L3. The switches SW3 and SW4 can be used to set the energy stored within the inductance L3 by charging or discharging the current in inductance L3. Precision control of the amount of energy stored in the inductance L3 can be achieved by controlling the operation of the switch SW3. The switch SW4 can be dual purposed to isolate the energy storage element from the laser diode driver circuit 702. In some configurations, the switches SW1 and SW4 can be the same switch.

In the inductive implementation shown in FIG. 9, the power supply circuit 104 can charge the inductance L3 with enough energy to fire a burst of pulses. In some examples, the burst of pulses can be used for pulse coding, e.g., two or more sequential pulses. The laser diode driver circuit 702 can withdraw energy from the energy reservoir circuit 704 and, in particular, the inductance L3, by opening the switches SW4 and SW1 with each pulse. After the burst pulses have been fired, a control circuit, such as the control circuit 204 of FIG. 3, can control the switches SW3 and SW4 to charge the inductance L3.

When the inductance L3 is charged with enough energy, a control circuit, such as the control circuit 204 of FIG. 3, can control pulsing by controlling the operation of the switches SW4 and SW1 to transfer part of the stored energy in the inductance L3 to the capacitance C1 causing a voltage spike, which charges the inductance L1 to fire a laser pulse. To terminate the pulse, the control circuit can close the switch SW4 to stop the energy transfer and the pulse terminates when the inductance L1 is discharged. Multiple pulses can be achieved by controlling the switch SW4 to open multiple times.

Various RID laser diode driver techniques are described in commonly assigned U.S. patent application Ser. No. 16/555,506, titled "LASER DIODE DRIVER CIRCUIT TECHNIQUES" to S. Kuo et al. and filed on Aug. 29, 2019, the entire contents of which being incorporated by reference.

Figure 10:
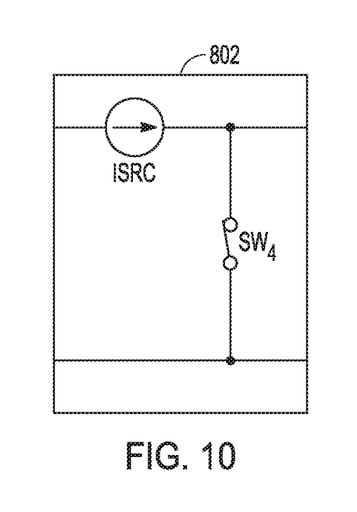
FIG. 10 depicts another example of an energy reservoir circuit that can implement techniques of this disclosure.

FIG. 10 depicts another example of an energy reservoir circuit that can implement techniques of this disclosure. The energy reservoir circuit 802 of FIG. can utilize a current source ISRC instead of the inductance L3 of FIG. 9 as an energy storage element and can be combined with a power supply circuit, such as the power supply circuit 104 of FIG.

9, and with a RD laser diode driver circuit, such as the RD laser diode driver circuit 702 of FIG. 9. In addition, the energy reservoir circuit 802 of FIG. 10 can include a switch SW4 coupled to the current source ISRC and in parallel with a laser diode driver circuit.

Figure 11:
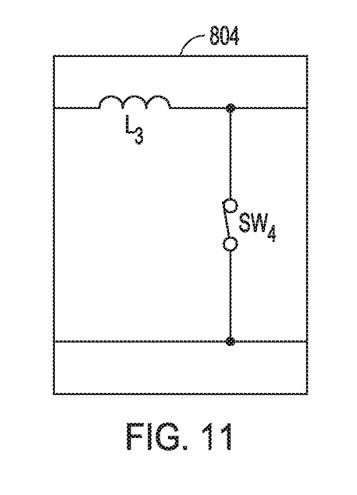
FIG. 11 depicts another example of an energy reservoir circuit that can implement techniques of this disclosure.

FIG. 11 depicts another example of an energy reservoir circuit that can implement various techniques of this disclosure. The energy reservoir circuit 804 of FIG. 11 can include an inductance L3 and a switch SW4, like the energy reservoir circuit 704 of FIG. 9, but does not include the switch SW3 of energy reservoir circuit 704 of FIG. 9. The laser diode driver circuit 702 can keep firing until the energy stored in the inductance L3 is depleted.

Figure 12:
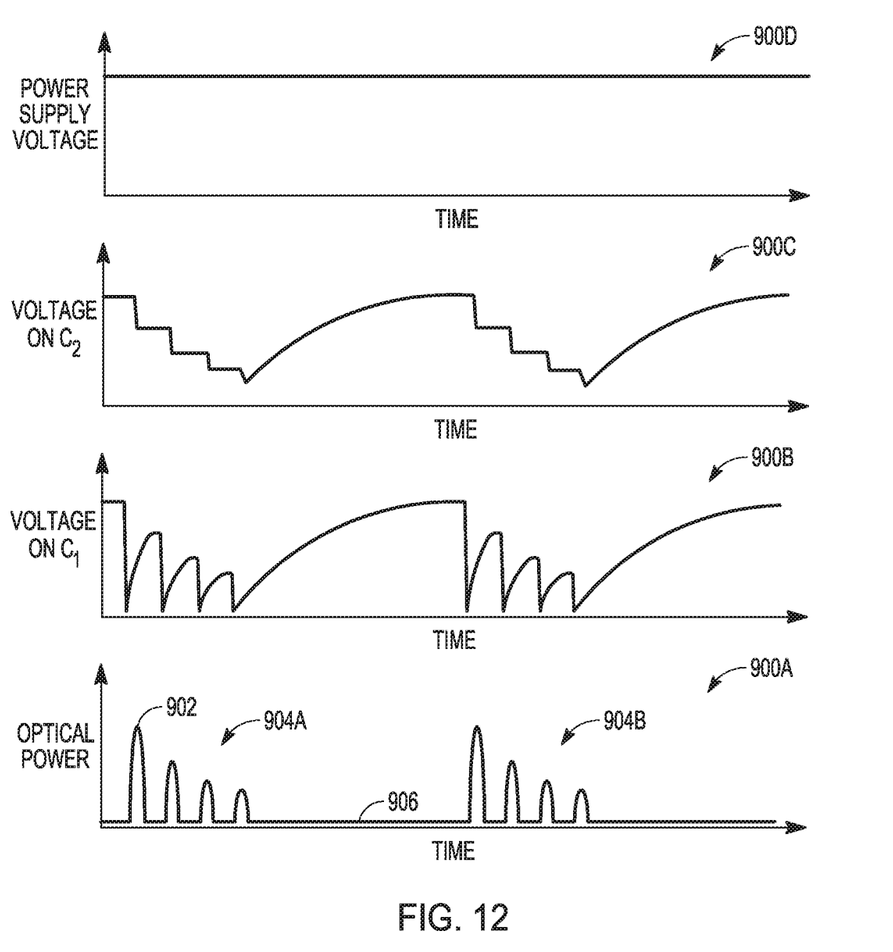
FIG. 12 depicts various non-limiting conceptual waveforms with respect to the optical transmitter circuit of FIG. 5 that utilizes a capacitive energy reservoir circuit.

FIG. 12 depicts various non-limiting conceptual waveforms with respect to the optical transmitter circuit of FIG. 5 that utilizes a capacitive energy reservoir circuit. Four graphs 900A-900D are shown with respect to time in FIG. 12.

The bottom graph 900A of FIG. 12 depicts the optical power of each pulse 902. Two bursts of pulses 904A, 904B are depicted and are separated by an idle time 906, with each burst including four pulses in the non-limiting example shown in the bottom graph 900A.

The graph 900B of FIG. 12 depicts the voltage on the capacitance C1, which forms part of the LC circuit of the laser diode driver circuit 102 in FIG. 5, for example. In the non-limiting example shown, the voltage on the capacitance C1 drops close to zero volts to generate a pulse 902 of the bottom graph 900A, then partially recovers after the capacitance C2 charges up the capacitance C1 before dropping close to zero volts again to generate the next pulse. After the laser diode driver circuit fires the pulses, the charge on the capacitance C1 can be depleted. During the idle time 906 between bursts of pulses, the power supply transfers charge to the capacitance C2 in preparation for a next burst of pulses. In some implementations, the capacitance C1 can be left depleted during most of the idle time 906. Then, just prior to the next burst of pulses, the capacitance C2 can be used to charge the capacitance C1 (similar to the operation of the non-first pulses described earlier).

The graph 900C of FIG. 12 depicts the voltage on the capacitance C2, which is the energy storage element of the energy reservoir circuit. The capacitance C2 is sized to store energy sufficient for the laser diode driver to generate multiple output current pulses. In the non-limiting example shown, the voltage on the capacitance C2 drops slightly each time that the laser diode driver circuit fires a pulse, forming a stair-step pattern. After the laser diode driver circuit fires the pulses, the charge on the capacitance C2 can be partially depleted or nearly depleted. During the idle time 906 between bursts of pulses, the power supply can transfer charge to the capacitance C2 in preparation for a next burst of pulses.

The top graph 900D of FIG. 12 depicts the voltage of the power supply 104 in FIG. 5, which can remain constant.

Figure 13:
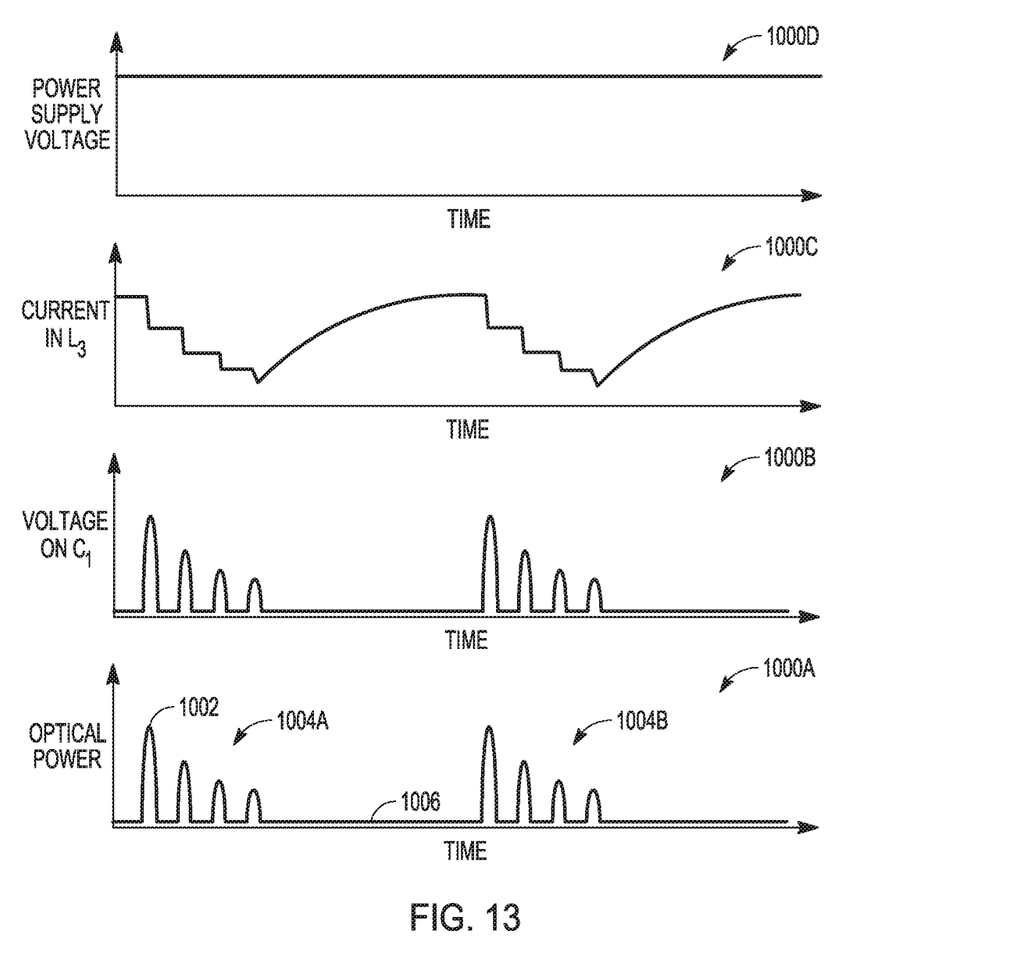
FIG. 13 depicts various non-limiting conceptual waveforms with respect to the optical transmitter circuit of FIG. 9 that utilizes an inductive energy reservoir circuit.

FIG. 13 depicts various non-limiting conceptual waveforms with respect to the optical transmitter circuit of FIG. 9 that utilizes an inductive energy reservoir circuit. Four graphs 1000A-1000D are shown with respect to time in FIG. 13.

The bottom graph 1000A of FIG. 13 depicts the optical power of each pulse 1002. Two bursts of pulses 1004A, 1004B are depicted and are separated by an idle time 1006, with each burst including four pulses in the non-limiting example shown in the bottom graph 1000A.

The graph 1000B of FIG. 13 depicts the voltage on the capacitance C1, which forms part of the LC circuit of the laser diode driver circuit 102 in FIG. 9. In the non-limiting example shown, the voltage on the capacitance C1 pulses to generate a pulse 1002 of the bottom graph 1000A, then pulses again to generate the next pulse.

The graph 1000C of FIG. 13 depicts the current in the inductance L3, which is the energy storage element of the energy reservoir circuit of FIG. 9. The inductance L3 is sized to store energy sufficient for the laser diode driver to generate multiple output current pulses. In the non-limiting example shown, the current in the inductance L3 drops slightly each time that the laser diode driver circuit fires a pulse, forming a stair-step pattern. After the laser diode driver circuit fires the pulses, the current in the inductance L3 can be partially depleted or nearly depleted. During the idle time 1006 between bursts of pulses, the power supply can transfer energy to the inductance L3 in preparation for the next burst of pulses.

The top graph 1000D of FIG. 13 depicts the voltage of the power supply 704 in FIG. 9, for example, which can remain constant.

By using the techniques described above, an energy reservoir circuit can store enough energy to allow an RD laser diode driver circuit to generate multiple output current pulses that, in some implementations, can be used for pulse coding. Use of the energy reservoir circuit can, among other things, relax the peak current requirement of the power supply.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An optical transmitter circuit comprising:
    a laser diode driver including an LC circuit coupled to a laser diode, wherein the LC circuit is configured to form a resonance that determines a transmitted optical pulse width and to transfer energy to the laser diode for an individual optical current pulse;
    an energy reservoir circuit coupled to the laser diode driver and to a power supply circuit, the energy reservoir circuit including an energy storage element sized to store energy sufficient for the laser diode driver to generate multiple output current pulses, wherein the energy reservoir circuit is configured to receive energy from the power supply circuit and transfer at least some of the received energy to the LC circuit; and
    an isolation circuit configured to intermittently electrically isolate the energy storage element from the laser diode driver.

2. The optical transmitter circuit of claim 1, wherein the multiple output current pulses form a sequence of pulses.

3. The optical transmitter circuit of claim 2, wherein the sequence of pulses is a coded sequence of pulses.

4. The optical transmitter circuit of claim 1, wherein the energy reservoir circuit is configured to transfer energy to the LC circuit between individual output current pulses.

5. The optical transmitter circuit of claim 1, wherein the LC circuit includes a first capacitance, and wherein the energy storage element includes a second capacitance.

6. The optical transmitter of claim 5, wherein the isolation circuit is configured to electrically isolate the second capacitance from the laser diode driver during individual output current pulses such that the second capacitance does not interact with a resonance of the LC circuit for a duration of the individual output current pulses.

7. The optical transmitter circuit of claim 1, wherein the isolation circuit includes a switch.

8. The optical transmitter circuit of claim 1, wherein the isolation circuit includes a resistance.

9. The optical transmitter circuit of claim 1, wherein the isolation circuit includes an inductance.

10. The optical transmitter circuit of claim 1, wherein the isolation circuit includes a diode.

11. The optical transmitter circuit of claim 1, wherein the LC circuit includes a first inductance, wherein the energy storage element includes a second inductance, and wherein the energy reservoir circuit includes a switch coupled to the second inductance and in parallel with the laser diode driver.

12. The optical transmitter circuit of claim 1, wherein the energy storage element includes a current source, and wherein the energy reservoir circuit includes a switch coupled to the current source and in parallel with the laser diode driver.

13. The optical transmitter circuit of claim 1, wherein the LC circuit includes a capacitance, and wherein the capacitance is a parasitic capacitance intrinsic to circuit components of the laser diode driver, the isolation circuit, and interconnects therebetween.

14. The optical transmitter circuit of claim 1, wherein the LC circuit includes an inductance, and wherein the inductance is a parasitic inductance intrinsic to circuit components of the laser diode driver and interconnects therebetween.

15. A method of generating output current pulses of a diode, the method comprising:
    transferring energy from a power supply circuit to an energy storage element of an energy reservoir circuit, the energy storage element sized to store energy for a laser diode driver to generate multiple output current pulses;
    transferring at least some of the energy stored in the energy storage element to a resonant discharge laser driver circuit including a laser diode; and
    intermittently electrically isolating the energy storage element from the resonant discharge laser driver circuit.

16. The method of claim 15, comprising:
    generating a pulse code using the multiple output current pulses.

17. The method of claim 16, comprising:
    controlling switch operation to control a timing of the pulse code.

18. The method of claim 16, comprising:
    controlling switch operation to control an amplitude of individual output current pulses.

19. An optical transmitter circuit comprising:
    a laser diode driver including an LC circuit coupled to a laser diode, wherein the LC circuit is configured to form a resonance that determines a transmitted optical pulse width and to transfer energy to the laser diode for an individual optical current pulse;

means for storing energy sufficient for the laser diode driver to generate multiple output current pulses, the means for storing energy coupled to the laser diode driver and to a power supply circuit, wherein the means for storing energy is configured to receive energy from the power supply circuit and transfer at least some of the received energy to the LC circuit; and an isolation circuit configured to intermittently electrically isolate the means for storing energy from the laser diode driver.

20. The optical transmitter circuit of claim 19, wherein the LC circuit includes a first capacitance, and wherein the means for storing energy includes a second capacitance.

* * * * *